(12) United States Patent
Ichinose

(10) Patent No.: US 8,547,765 B2
(45) Date of Patent: Oct. 1, 2013

(54) SEMICONDUCTOR DEVICE HAVING SENSE AMPLIFIERS

(75) Inventor: Akira Ichinose, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 82 days.

(21) Appl. No.: 12/929,758

(22) Filed: Feb. 14, 2011

(65) Prior Publication Data

US 2011/0205821 A1 Aug. 25, 2011

(30) Foreign Application Priority Data

Feb. 23, 2010 (JP) ................................. 2010-037539

(51) Int. Cl.
*G11C 7/00* (2006.01)

(52) U.S. Cl.
USPC .................. 365/205; 365/189.09; 365/230.03

(58) Field of Classification Search
USPC .................... 365/154, 205–207, 230, 189.09, 365/230.05
See application file for complete search history.

(56) References Cited

U.S. PATENT DOCUMENTS

| 6,205,071 | B1 * | 3/2001 | Ooishi ........................... 365/207 |
| 7,259,992 | B2 * | 8/2007 | Shirota .................... 365/185.21 |
| 2007/0159874 | A1 * | 7/2007 | Yamaoka et al. ............. 365/154 |
| 2007/0297208 | A1 * | 12/2007 | Matano ............................ 365/51 |
| 2008/0008014 | A1 * | 1/2008 | Matano .................... 365/189.11 |
| 2010/0014342 | A1 * | 1/2010 | Hoya et al. .................... 365/145 |

FOREIGN PATENT DOCUMENTS

JP 05-036277 2/1993

* cited by examiner

*Primary Examiner* — Hoai V Ho
(74) *Attorney, Agent, or Firm* — McGinn IP Law Group, PLLC

(57) ABSTRACT

A semiconductor device includes a plurality of memory cells connected to a word line, sense amplifiers arranged correspondingly to the memory cells, and a sense-amplifier control circuit that activates the sense amplifiers in response to selection of the word line and temporarily reduces driving performance of the sense amplifiers in response to a request for writing of data to any one of the memory cells. With this configuration, inverted data can be quickly overwritten to the sense amplifier. Furthermore, because a collective control is executed on the sense amplifiers to be activated, instead of individually controlling the sense amplifiers to be activated, the circuit scale of the sense-amplifier control circuit can be reduced.

18 Claims, 12 Drawing Sheets

SEMICONDUCTOR DEVICE HAVING SENSE AMPLIFIERS

BACKGROUND OF THE INVENTION

1. Field of the Invention

The present invention relates to a semiconductor device, and more particularly relates to a semiconductor device including sense amplifiers that amplify minimal data read from memory cells.

2. Description of Related Art

A semiconductor memory such as a DRAM (Dynamic Random Access Memory) includes sense amplifiers that amplify minimal data read from memory cells. In the DRAM, for example, the sense amplifiers perform amplification of read data during a read operation and also perform a data restore operation for unselected memory cells during a read operation and a write operation.

That is, either during the read operation or during the write operation, when a predetermined word line is selected based on a row address, all memory cells connected to the word line are electrically connected to corresponding sense amplifiers via bit lines, respectively. This enables to amplify data held in these memory cells and restore data in memory cells having been destroyed or reduced in amounts by outflow or inflow of electric charges due to the selection of the word line. An output of a sense amplifier selected by a column address is then outputted outside during a read operation, and write data is overwritten to a sense amplifier selected by a column address during a write operation.

In this manner, arbitrary write data is overwritten to a sense amplifier that is already in an active state during the write operation, and therefore the sense amplifier in the active state needs to be forcibly inverted when a logical level before the overwriting and a logical level of the write data are opposite to each other. Accordingly, the overwriting of data requires more time and power consumption increases as compared to a case where a logical level before overwriting and a logical level of write data are the same.

As a method for solving this problem, Japanese Patent Application Laid-open No. H5-36277 describes a method that enables to selectively inactivate a sense amplifier specified by a column address during a write operation. According to this method, the need to forcibly invert the sense amplifier can be eliminated, which enables to quickly perform overwriting of data and reduce power consumption regardless of a relation between a logical level before overwriting and a logical level of write data. Because unselected sense amplifiers can be activated as usual, a restore operation can be also performed correctly.

However, in the method described in Japanese Patent Application Laid-open No. H5-36277, a sense amplifier specified by a column address needs to be selectively inactivated during a write operation, and therefore a control circuit for inactivating a sense amplifier needs to be provided for each of the sense amplifiers. This greatly increases a chip area.

This problem occurs not only in DRAMs but occurs generally in semiconductor devices that need to forcibly invert sense amplifiers during a write operation. That is, this problem occurs also in semiconductor memories other than DRAMs and semiconductor devices that include such a semiconductor memory in a part thereof.

SUMMARY

In one embodiment, there is provided a semiconductor device that includes: a plurality of memory cells connected to a common word line; a plurality of sense amplifiers arranged correspondingly to the memory cells; and a control circuit that activates the sense amplifiers in response to selection of the word line and temporarily reduces driving performances of the sense amplifiers in response to a request for writing of data to any one of the memory cells.

In another embodiment, there is provided a semiconductor device that includes: a plurality of bit lines that are respectively connected to a plurality of memory cells; a plurality of sense amplifiers that are respectively connected to the bit lines, and are connected to first and second supply lines in common; and a control circuit that supplies a first voltage between the first and second supply lines during a first period in an activation period of a sense-amplifier activation signal that is activated in response to an active command and stops supply of the first voltage during a second period in response to a write command in the activation period of the sense-amplifier activation signal.

According to the present invention, a collective control is executed on the sense amplifiers to be activated, instead of individually controlling the sense amplifiers to be activated. Therefore, the circuit scale of the control circuit can be reduced. This enables to suppress an increase in a chip area. Furthermore, because the control corresponding to a write operation is only temporary, data of unselected memory cells can be also restored correctly.

BRIEF DESCRIPTION OF THE DRAWINGS

The above features and advantages of the present invention will be more apparent from the following description of certain preferred embodiments taken in conjunction with the accompanying drawings, in which:

FIG. 10 is a circuit diagram of a SAP control circuit 300a;

DETAILED DESCRIPTION OF THE EMBODIMENTS

Preferred embodiments of the present invention will be explained below in detail with reference to the accompanying drawings.

Figure 1:
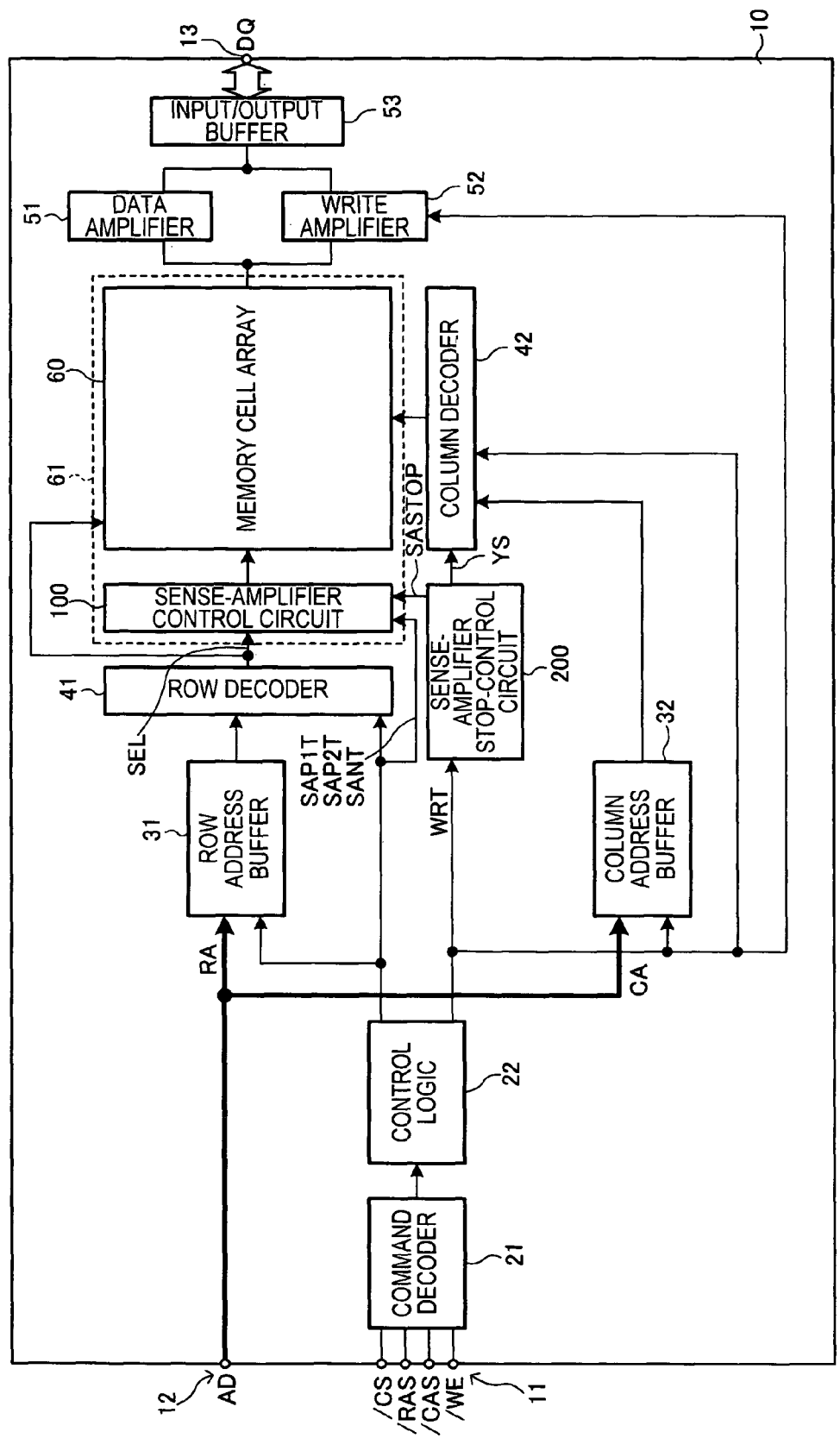
FIG. 1 is a block diagram showing a general configuration of a semiconductor device 10 according to a first embodiment of the present invention.

FIG. 1 is a block diagram showing a general configuration of a semiconductor device 10 according to a first embodiment of the present invention. Although not particularly limited thereto, the semiconductor device 10 according to the first embodiment is a DRAM integrated on a single semiconductor chip.

As shown in FIG. 1, the semiconductor device 10 according to the first embodiment includes at least a command terminal 11, an address terminal 12, and a data terminal 13 as external terminals. In practice, although not shown in FIG. 1, the semiconductor device 10 also includes a supply terminal, a strobe terminal and the like.

The command terminal 11 is a terminal to which command signals including a chip selection signal /CS, a row address strobe signal /RAS, a column address strobe signal /CAS, a write enable signal /WE and the like are inputted from outside. A combination of these command signals is decoded by a command decoder 21, and a result of the decoding is supplied to a control logic 22.

The control logic 22 generates various internal commands based on the result of the decoding by the command decoder 21 and supplies the generated internal commands to various circuit blocks. For example, when the result of the decoding by the command decoder 21 indicates an active command, sense-amplifier activation signals SAP1T, SAP2T, and SANT are activated at predetermined timing and supplied to a sense-amplifier control circuit 100, which will be explained later. When the result of the decoding by the command decoder 21 indicates a write command, a write signal WRT is activated and supplied to a write amplifier 52 and a sense-amplifier stop-control circuit 200, which will be explained later.

The address terminal 12 is a terminal to which an address signal AD is inputted from outside. The inputted address signal AD is supplied to a row address buffer 31 or a column address buffer 32. The row address buffer 31 is selected by the control logic 22 when the command signal indicates an active command (ACT). The address signal AD inputted to the address terminal 12 when the command signal indicates the active command is a row address RA. On the other hand, the column address buffer 32 is selected by the control logic 22 when the command signal indicates a read command (READ) or a write command (WRITE). The address signal AD inputted to the address terminal 12 when the command signal indicates the read command or the write command is a column address CA.

The row address RA brought in the row address buffer 31 is supplied to a row decoder 41. The row decoder 41 decodes the row address RA and supplies a result of the decoding to a memory cell array 60 and the sense-amplifier control circuit 100. Details of the sense-amplifier control circuit 100 will be explained later. On the other hand, the column address CA brought in the column address buffer 32 is supplied to a column decoder 42. The column decoder 42 decodes the column address CA and supplies a result of the decoding to the memory cell array 60.

The memory cell array 60 is a circuit block including a plurality of memory cells and a plurality of sense amplifiers. Selection of a memory cell included in the memory cell array 60 is performed by the row decoder 41 and the column decoder 42. During a read operation, read data that is read from a selected memory cell is amplified by a corresponding sense amplifier, amplified further by a data amplifier 51, and then outputted to the data terminal 13 via an input/output buffer 53. On the other hand, during a write operation, write data inputted to the data terminal 13 is written to a selected memory cell via the input/output buffer 53 and a write amplifier 52. At that time, during the write operation, because a sense amplifier corresponding to a memory cell as a write target holds data before overwriting, that is, data that is read from the corresponding memory cell, the sense amplifier needs to be forcibly inverted when a logical level of the write data is opposite to a logical level of the data before overwriting.

As shown in FIG. 1, the semiconductor device 10 according to the first embodiment further includes the sense-amplifier stop-control circuit 200. The sense-amplifier stop-control circuit 200 activates a sense-amplifier stop signal SASTOP and a column enable signal YS in response to the write signal WRT outputted from the control logic 22. Details of the sense-amplifier stop-control circuit 200 will be explained later.

Figure 2:
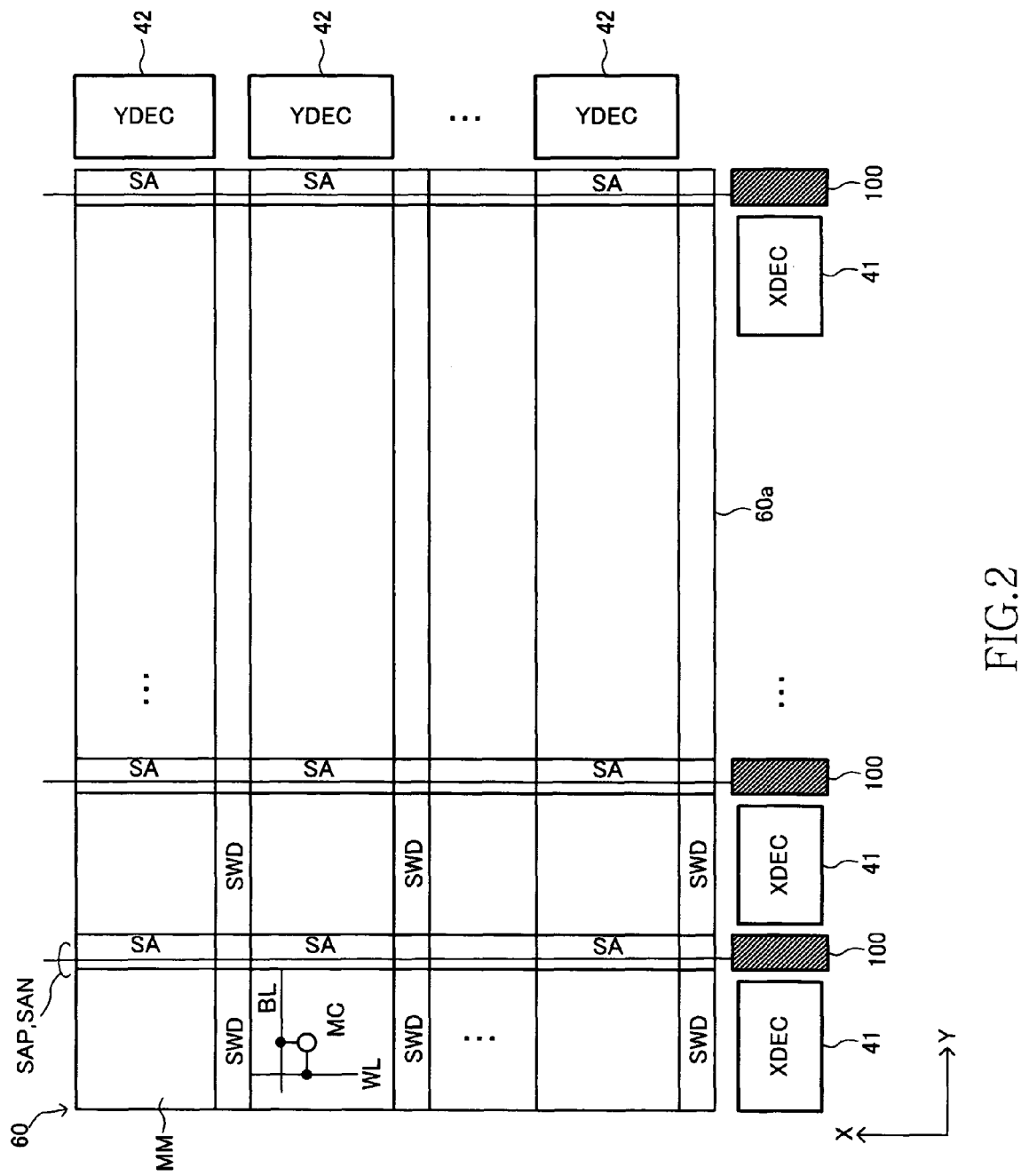
FIG. 2 is a schematic diagram for explaining a configuration of a memory cell array 60.

FIG. 2 is a schematic diagram for explaining a configuration of the memory cell array 60.

As shown in FIG. 2, the memory cell array 60 has a configuration in which a plurality of memory mats MM are arranged in X and Y directions like a matrix. A sub-word driver SWD is placed between the memory mats MM adjacent in the X direction, and a sense amplifier SA is placed between the memory mats MM adjacent in the Y direction. The sub-word driver SWD is a circuit that selects a word line WL extending in the X direction within corresponding memory mats MM, and an operation thereof is controlled by the row decoder 41. The sense amplifier SA is a circuit that amplifies a potential of a bit line extending in the Y direction within corresponding memory mats MM, and an operation thereof is controlled by the sense-amplifier control circuit 100.

In the first embodiment, the row decoder 41 and the sense-amplifier control circuit 100 are arranged outside the memory cell array 60 along a side 60a of the memory cell array 60. This layout is suitable when the memory cell array 60 includes no room where the sense-amplifier control circuit 100 is to be placed. The sense-amplifier control circuit 100 is connected to supply lines SAP and SAN and functions to drive the supply lines SAP and SAN. As shown in FIG. 2, the supply lines SAP and SAN are arranged along the sense amplifiers SA extending in the X direction and connected to the corresponding sense amplifiers SA in common.

Figure 3:
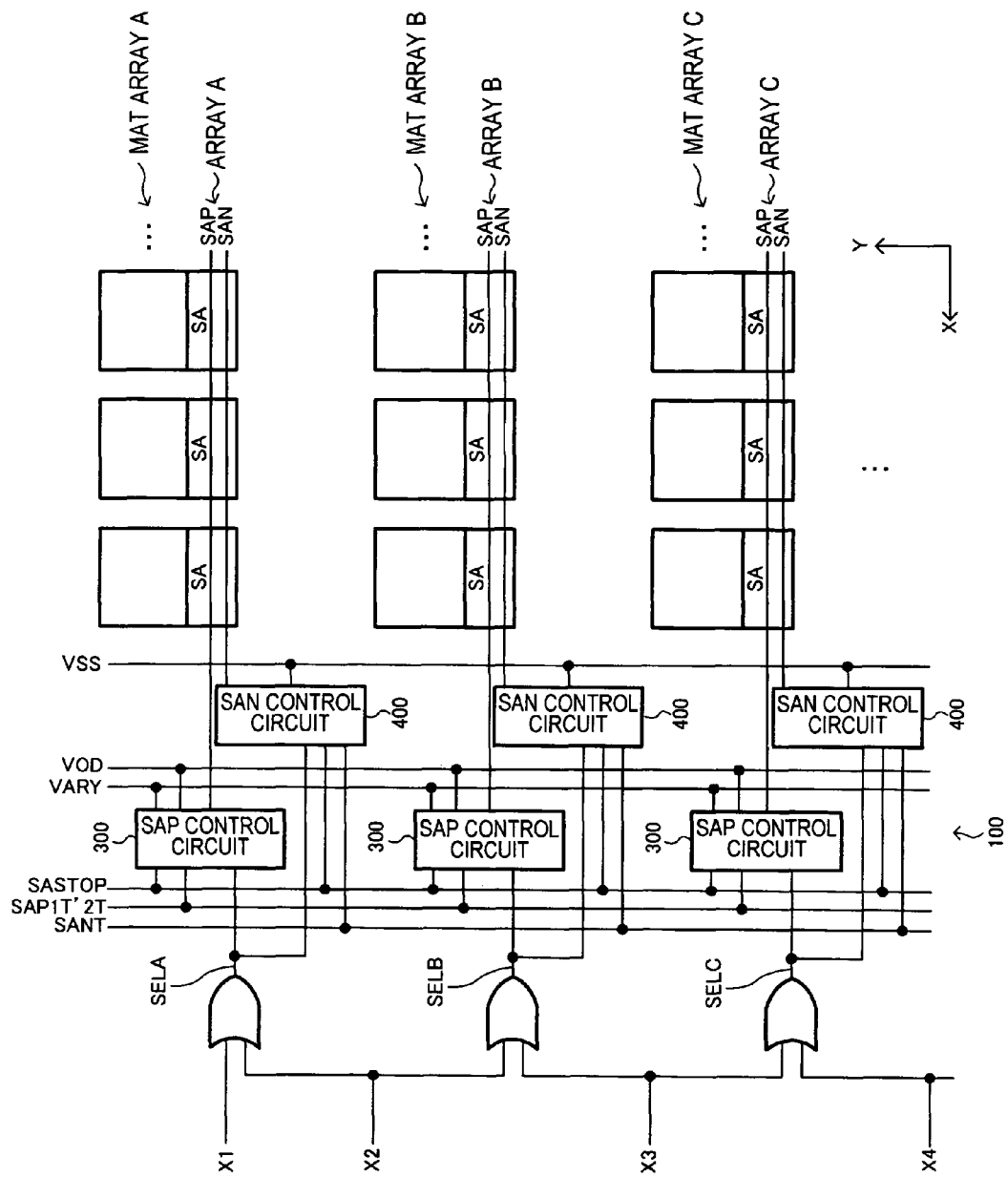
FIG. 3 is a schematic diagram for explaining the configuration of the memory cell array 60 in more detail, and shows main parts of an area 61 shown in FIG. 1 in an enlarged manner.

FIG. 3 is a schematic diagram for explaining the configuration of the memory cell array 60 in more detail, and shows main parts of an area 61 shown in FIG. 1 in an enlarged manner.

As shown in FIG. 3, the sense-amplifier control circuit 100 includes a plurality of SAP control circuits 300 and a plurality of SAN control circuits 400. The SAP control circuit 300 and the SAN control circuit 400 are arranged for each of sense amplifier arrays (arrays A, B, C, . . . ) extending in an X direction and supply an operating voltage to corresponding sense amplifiers SA.

The sense-amplifier activation signals SAP1T and SAP2T and the sense-amplifier stop signal SASTOP are supplied in common to these SAP control circuits 300. At least an overdrive potential VOD and an array potential VARY (<VPP) are supplied to the SAP control circuits 300 as supply potentials. On the other hand, the sense-amplifier activation signal SANT and the sense-amplifier stop signal SASTOP are supplied in common to the SAN control circuits 400. At least a ground potential VSS is supplied to the SAN control circuits 400 as a supply potential.

Corresponding selection signals SELA, SELB, SELC, . . . are supplied to the SAP control circuits 300 and the SAN control circuits 400, respectively. The selection signals SELA, SELB, SELC, . . . are generated based on pre-decode signals X1, X2, X3, X4, . . . , which are obtained by decoding apart of the row address RA. Specifically, when the mat array A is to be accessed, the pre-decode signal X1 is activated and the selection signal SELA is activated in response thereto. When the mat array B is to be accessed, the pre-decode signal X2 is activated and the selection signals SELA and SELB are activated in response thereto. When the mat array C is to be accessed, the pre-decode signal X3 is activated and the selection signals SELB and SELC are activated in response thereto.

A reason why two selection signals (SELA and SELB, for example) are activated by one pre-decode signal (X2, for example) is that the memory cell array 60 adopts a so-called open bit line method in the first embodiment and therefore it is necessary to activate the sense amplifiers SA on both sides in a Y direction of memory mats MM to be accessed. However, with respect to memory mats MM located at an end in the Y direction like those in the mat array A shown in FIG. 3, the sense amplifiers SA are located only one side thereof. Accordingly, when these memory mats MM are to be accessed, only one selection signal (SELA, for example) is activated by one pre-decode signal (X1, for example).

Figure 4:
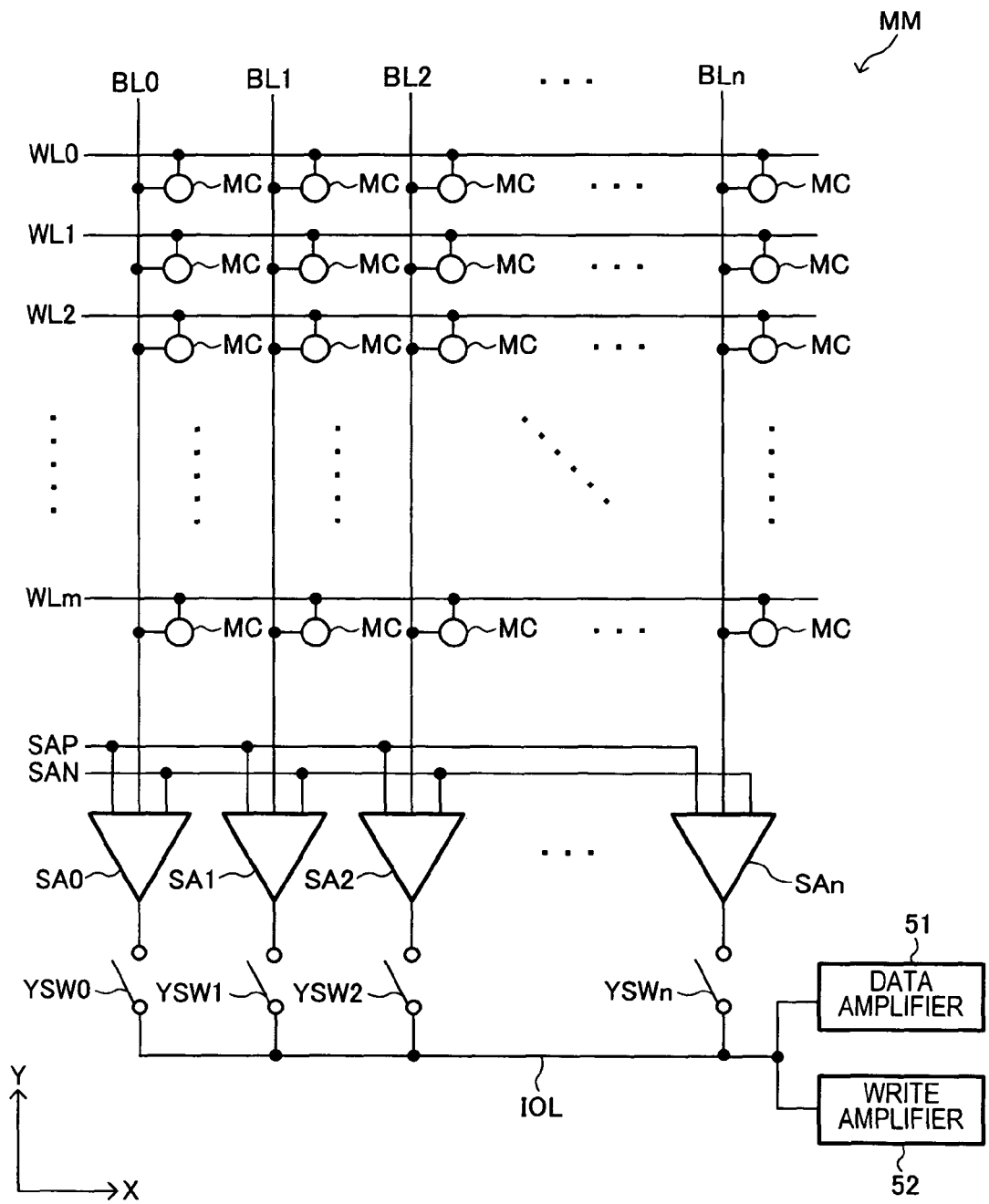
FIG. 4 is a circuit diagram showing a configuration in a memory mat MM.

FIG. 4 is a circuit diagram showing a configuration in the memory mat MM. p As shown in FIG. 4, the memory mat MM includes a plurality of word lines WL0 to WLm extending in an X direction, a plurality of bit lines BL0 to BLn extending in a Y direction, and a plurality of memory cells MC each being placed at each of intersections of the word lines and the bit lines. Selection of the word lines WL0 to WLm is performed by the row decoder 41 based on the row address RA.

With this configuration, when one of the word lines WL0 to WLm is selected, the memory cells MC connected to the selected word line are connected to the corresponding bit lines BL0 to BLn, respectively. The bit lines BL0 to BLn are connected to corresponding sense amplifiers SA0 to SAn, respectively, which enables data on the bit lines BL0 to BLn to be amplified by the corresponding sense amplifiers SA0 to SAn, respectively. The supply lines SAP and SAN are connected to the sense amplifiers SA0 to SAn in common, and therefore a same operating voltage is supplied to the sense amplifiers SA0 to SAn in common. For the sake of simplicity, only one of each pair of bit lines connected to each sense amplifier SA is shown in FIG. 4 and the other bit lines are omitted. The other bit lines are allocated to another adjacent memory mat MM.

The sense amplifiers SA0 to SAn are connected to a data wiring IOL via corresponding column switches YSW0 to YSWn, respectively. Selection of the column switches YSW0 to YSWn is performed by the column decoder 42 based on the column address CA. Accordingly, one of the bit lines BL0 to BLn is connected to the data wiring IOL, and read data outputted to the data wiring IOL is supplied to the data amplifier 51 during a read operation. During a write operation, write data outputted from the write amplifier 52 is supplied to the data wiring IOL and then the write data is supplied to the selected bit line via one of the column switches YSW0 to YSWn. This indicates that the write data is overwritten to the selected bit line. Operations of the column switches YSW0 to YSWn are performed in synchronization with the column enable signal YS shown in FIG. 1. The column enable signal YS is generated by the sense-amplifier stop-control circuit 200.

Figure 5:
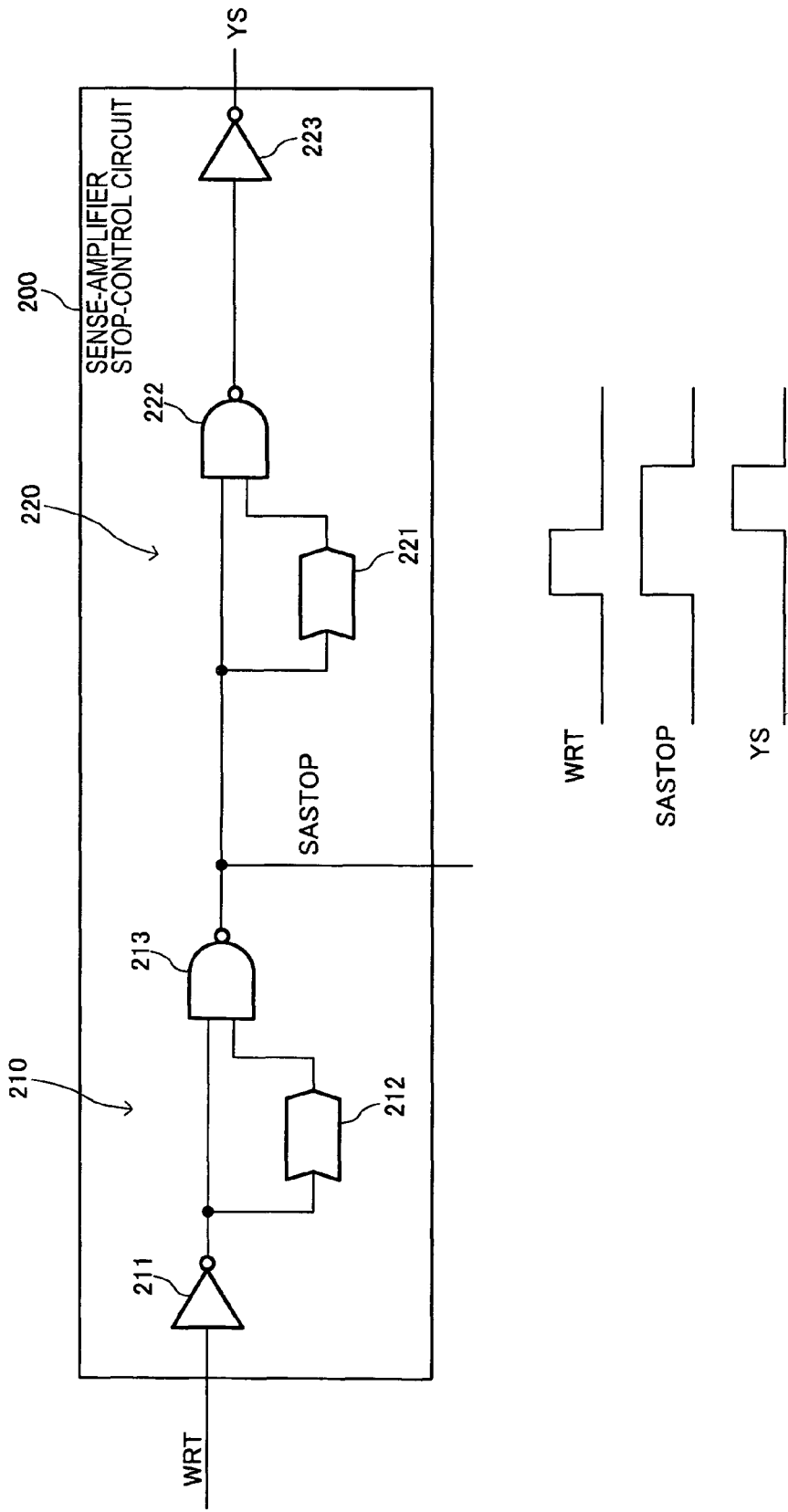
FIG. 5 is a circuit diagram of a sense-amplifier stop-control circuit 200.

FIG. 5 is a circuit diagram of the sense-amplifier stop-control circuit 200.

As shown in FIG. 5, the sense-amplifier stop-control circuit 200 generates the sense-amplifier stop signal SASTOP and the column enable signal YS based on the write signal WRT, and includes a pulse generating unit 210 that generates the sense-amplifier stop signal SASTOP and a pulse generating unit 220 that generates the column enable signal YS.

The pulse generating unit 210 includes an inverter 211 that inverts the write signal WRT, a delay circuit 212 that delays an output of the inverter 211, and a NAND circuit 213 that receives the output of the inverter 211 and an output of the delay circuit 212, and an output of the NAND circuit 213 becomes the sense-amplifier stop signal SASTOP. As shown in FIG. 5, the write signal WRT is pulsed, which enables the sense-amplifier stop signal SASTOP to have a waveform with a leading edge that is almost aligned with a leading edge of the write signal WRT and a trailing edge that is delayed by a delay of the delay circuit 212 from a trailing edge of the write signal WRT.

The pulse generating unit 220 includes a delay circuit 221 that delays the sense-amplifier stop signal SASTOP, a NAND circuit 222 that receives the sense-amplifier stop signal SASTOP and an output of the delay circuit 221, and an inverter 223 that inverts an output of the NAND circuit 222, and an output of the inverter 223 becomes the column enable signal YS. Therefore, the column enable signal YS has a waveform with a leading edge that is delayed by a delay of the delay circuit 221 from the leading edge of the sense-amplifier stop signal SASTOP and a trailing edge that is almost aligned with the trailing edge of the sense-amplifier stop signal SASTOP.

The sense-amplifier stop signal SASTOP generated by the sense-amplifier stop-control circuit 200 is supplied to the SAP control circuits 300 and the SAN control circuits 400.

Figure 6:
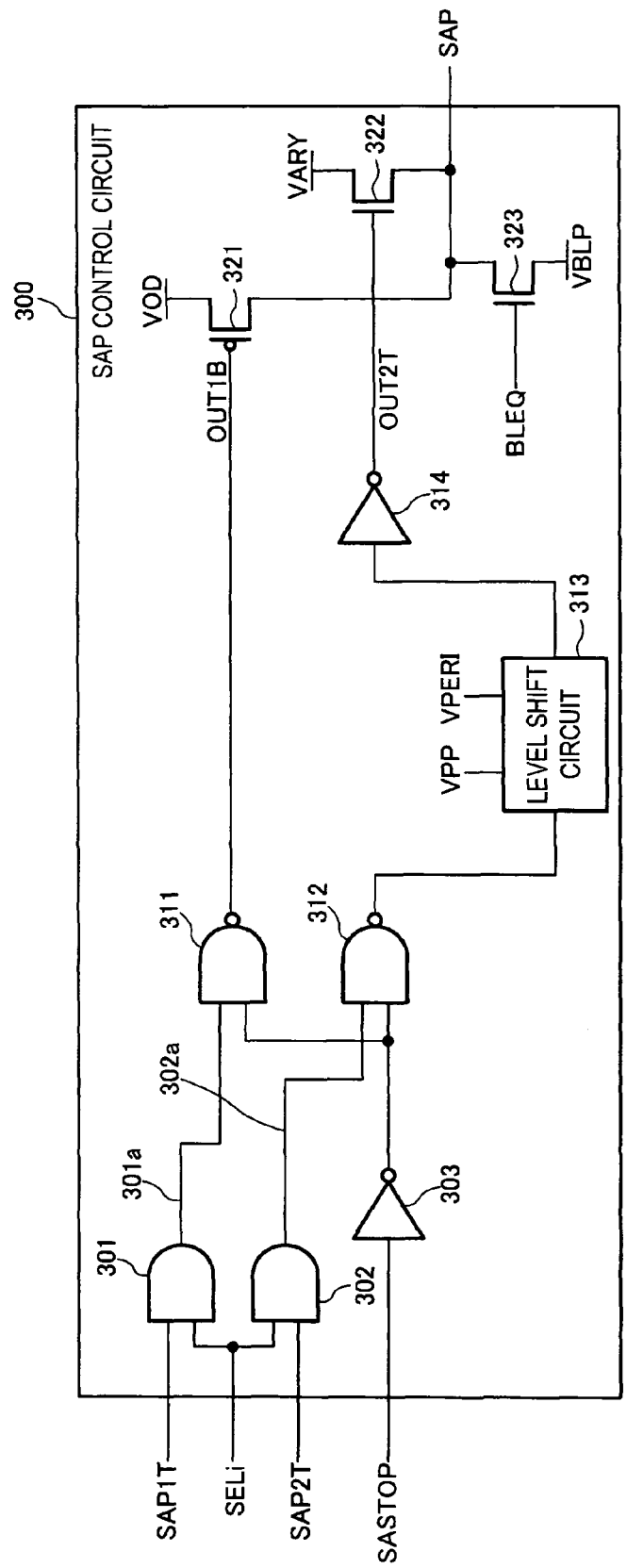
FIG. 6 is a circuit diagram of a SAP control circuit 300.

FIG. 6 is a circuit. diagram of the SAP control circuit 300. As explained with reference to FIG. 3, the sense-amplifier control circuit 100 includes the SAP control circuits 300 corresponding to the selection signals SELA, SELB, SELC, . . . , respectively, and FIG. 6 shows one of the SAP control circuits 300.

As shown in FIG. 6, the SAP control circuit 300 includes AND circuits 301 and 302 that receive a corresponding selection signal SELi (i=A, B, C, . . . ) in common and receive the sense-amplifier activation signals SAP1T and SAP2T, respectively. Accordingly, when the corresponding selection signal SELi is activated to a high level, output signals 301a and 302a from the AND circuits 301 and 302 have the same waveforms as those of the sense-amplifier activation signals SAP1T and SAP2T, respectively.

The signals 301a and 302a are supplied to one of input terminals of the NAND circuits 311 and 312, respectively. A signal that is obtained by inverting the sense-amplifier stop signal SASTOP with the inverter 303 is inputted to the other input terminal of the NAND circuits 311 and 312 in common. Accordingly, when the sense-amplifier stop signal SASTOP is inactivated to a low level, outputs from the NAND circuits 311 and 312 become inverted signals of the sense-amplifier activation signals SAP1T and SAP2T, respectively. On the other hand, when the sense-amplifier stop signal SASTOP is activated to a high level, outputs from the NAND circuits 311 and 312 are both fixed to a high level.

A signal OUT1B, which is an output of the NAND circuit 311, is supplied to a gate electrode of an overdrive transistor 321. The overdrive transistor 321 is a P-channel MOS transistor having a source to which the supply potential VOD is supplied and a drain that is connected to a corresponding supply line SAP. This enables the corresponding supply line SAP to be driven to the supply potential VOD when the signal OUT1B is activated to a low level.

On the other hand, an output of the NAND circuit 312 is supplied to a gate electrode of a driver transistor 322 via a level shift circuit 313 and an inverter 314. The driver transistor 322 is an N-channel MOS transistor having a drain to which the supply potential VARY is supplied and a source that is connected to a corresponding supply line SAP. The level shift circuit 313 converts an input signal with an amplitude between VSS and VPERI into an output signal with an amplitude between VSS and VPP (>VPERI). The potential VPP is used also for an operation potential of the inverter 314, and accordingly when a signal OUT2T is activated to a high level (a VPP level), the corresponding supply line SAP is driven to the supply potential VARY.

Further, the SAP control circuit 300 further includes an equalize transistor 323 connected between the corresponding supply line SAP and an intermediate potential VBLP. An equalization signal BLEQ is supplied to a gate electrode of the equalize transistor 323, which enables the supply line SAP to be driven to the intermediate potential VBLP when the equalization signal BLEQ is activated. The intermediate potential VBLP is a potential intermediate between the supply potential VARY and the ground potential VSS.

Figure 7:
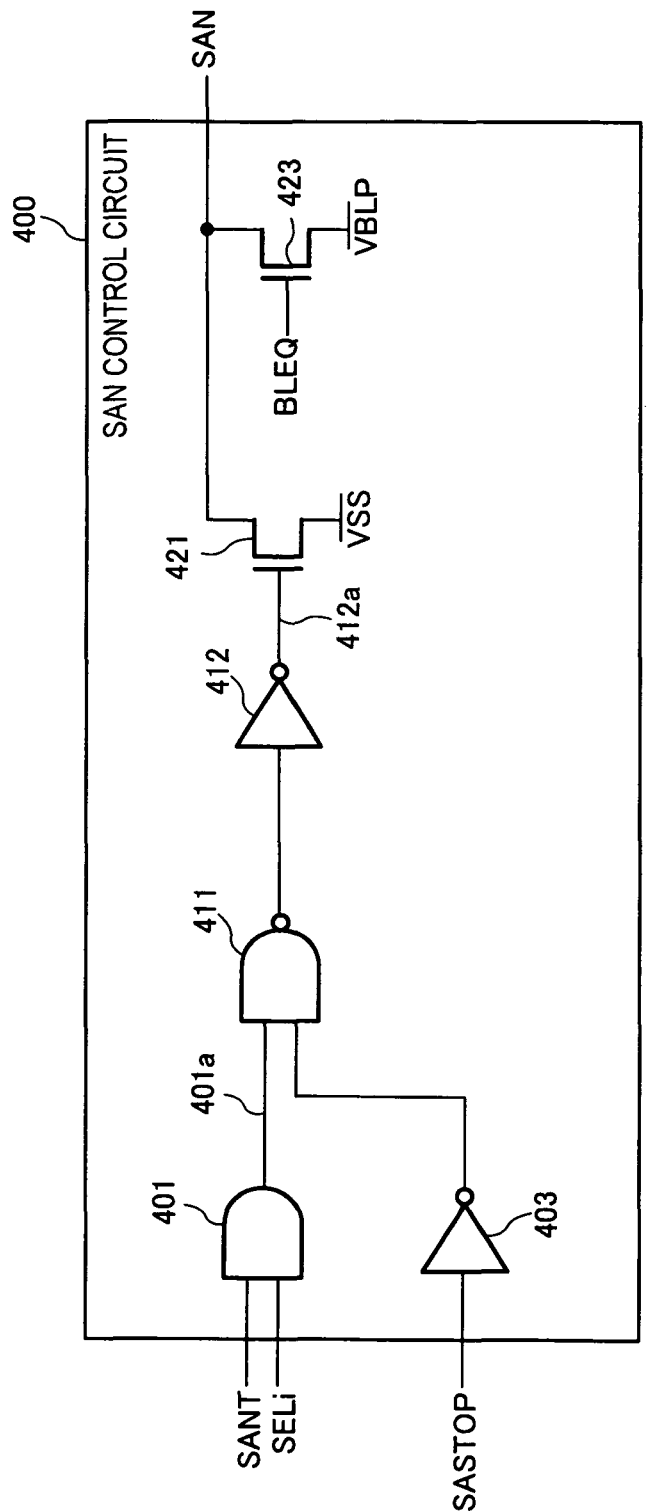
FIG. 7 is a circuit diagram of a SAN control circuit 400.

FIG. 7 is a circuit diagram of the SAN control circuit 400. As explained with reference to FIG. 3, the sense-amplifier control circuit 100 includes the SAN control circuits 400 corresponding to the selection signals SELA, SELB, SELC, . . . , respectively, and FIG. 7 shows one of the SAN control circuits 400.

As shown in FIG. 7, the SAN control circuit 400 includes an AND circuit 401 that receives a corresponding selection signal SELi (i=A, B, C, . . . ) and the sense-amplifier activation signal SANT. This enables an output signal 401a of the AND circuit 401 to have the same waveform as that of the sense-amplifier activation signal SANT when the corresponding selection signal SELi is activated to a high level.

The signal 401a is supplied to one of input terminals of a NAND circuit 411. A signal obtained by inverting the sense-amplifier stop signal SASTOP with an inverter 403 is inputted to the other input terminal of the NAND circuit 411. Accordingly, when the sense-amplifier stop signal SASTOP is inactivated to a low level, an output of the NAND circuit 411 becomes an inverted signal of the sense-amplifier activation signal SANT. On the other hand, when the sense-amplifier stop signal SASTOP is activated to a high level, an output of the NAND circuit 411 is fixed to a high level.

The output of the NAND circuit 411 is supplied to a gate electrode of a driver transistor 421 via an inverter 412. The driver transistor 421 is an N-channel MOS transistor having a source to which the ground potential VSS is supplied and a drain that is connected to the corresponding supply line SAN. This enables the corresponding supply line SAN to be driven to the ground potential VSS when a signal 412a, which is an output of the inverter 412, is activated to a high level.

The SAN control circuit 400 further includes an equalize transistor 423 connected between the corresponding supply line SAN and the intermediate potential VBLP. The equalization signal BLEQ is supplied to a gate electrode of the equalize transistor 423, which enables the supply line SAN to be driven to the intermediate potential VBLP when the equalization signal BLEQ is activated.

The circuit configuration of the semiconductor device 10 according to the first embodiment is as described above. An operation of the semiconductor device 10 according to the first embodiment is explained next.

Figure 8:
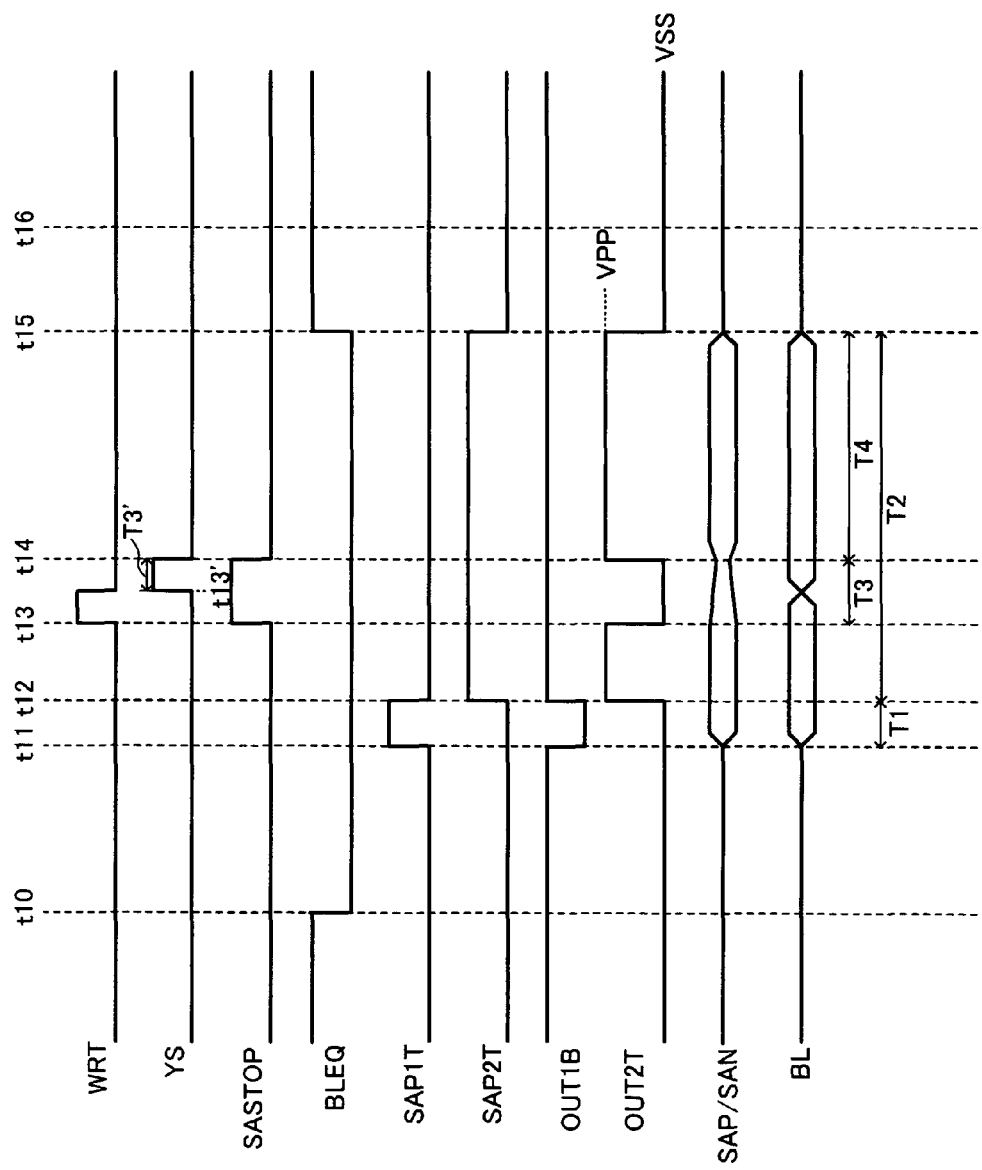
FIG. 8 is an operation waveform diagram for explaining a write operation of the semiconductor device 10.

FIG. 8 is an operation waveform diagram for explaining a write operation of the semiconductor device 10 according to the first embodiment.

At an initial state, the equalization signal BLEQ is active at a high level and accordingly both of the supply lines SAP and SAN are pre-charged at the intermediate potential VBLP. Next, when an active command (ACT) is inputted together with a row address RA, the equalization signal BLEQ is inactivated to a low level at a time t10 and the pre-charge of supply lines SAP and SAN is canceled. At that time, a pre-determined word line is selected based on the row address RA. For example, the word line WL0 shown in FIG. 4 is selected and data of all memory cells MC connected to the word line WL0 are outputted to the corresponding bit lines BL0 to BLn. This causes outflow or inflow of charges from/to these memory cells MC and therefore the data held in the memory cells MC are once destroyed or reduced in amounts.

Next, the sense-amplifier activation signal SAP1T is activated during a period T1 between a time t11 and a time t12 and further the sense-amplifier activation signal SAP2T is activated during a period T2 between the time t12 and a time t15. This causes the signal OUT1B to be activated to a low level during the period T1 and the supply line SAP to be driven to the supply potential VOD. During the period T2, the signal OUT2T is activated to a high level and the supply line SAP is driven to the supply potential VARY. As a result, the sense amplifiers SA are activated during the periods T1 and T2. Here, a reason why the supply line SAP is driven to the supply potential VOD (>VARY) at an initial time of activation of the sense amplifiers SA (during the period T1) is to quickly increase the potential of the supply line SAP that is pre-charged at the intermediate potential VBLP. When the sense amplifiers SA are activated, the potentials of the bit lines BL0 to BLn are amplified and the data of the memory cells MC once destroyed or reduced in amounts are restored.

Next, when a write command (WRITE) is inputted together with a column address CA, the sense-amplifier stop signal SASTOP is activated to a high level during a period T3 between a time t13 and a time t14, which is in the middle of the period T2. This causes driving of the supply lines SAP and SAN by the driver transistors 322 and 421 to be temporarily stopped and a voltage between the supply lines SAP and SAN to be lowered from VARY-VSS to a smaller value during the period T3. Therefore, during the period T3, driving performances of the activated sense amplifiers SA are temporarily reduced and the sense amplifiers SA will be inactivated if they are left unsettled.

As shown in FIG. 8, the column enable signal YS is activated during a period T3' from a time t13', which is a little later than the time t13, to the time t14. As described above, the column enable signal YS is a timing signal for activating a selected one of the column switches YSW0 to YSWn and therefore it indicates that the selected column switch is turned on during the period T3'. This enables write data supplied from the write amplifier 52 to be supplied to the bit line selected via the column switch. At that time, the selected bit line is in a state where data before overwriting is amplified by the sense amplifier SA and accordingly when the write data is inverted data of the data before overwriting, the sense amplifier SA needs to be inverted.

However, at a time t3', the sense amplifier SA is in a reduced performance state or inactivated state and the driving performance is reduced or almost lost. Therefore, the sense amplifier SA can be inverted quickly. Unlike the case where the sense amplifier SA in an activated state is forcibly inverted, no leakage current flows.

During a period T4 between the time t14 and the time t15, the sense amplifiers SA are activated again and therefore the data latched in the sense amplifiers SA are restored to the original memory cells MC. Thereafter, when a pre-charge command (PRE) is issued at a time t15, the equalization signal BLEQ is activated to a high level, thereby returning to the initial state.

Figure 9:
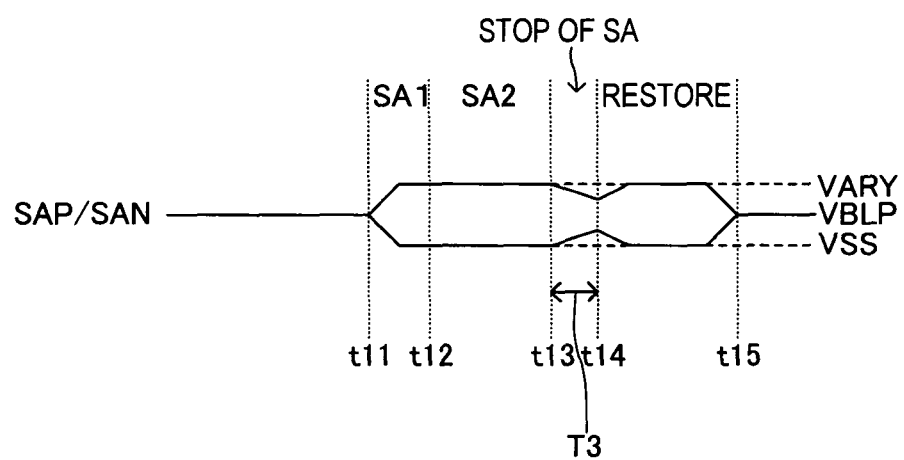
FIG. 9 is a waveform diagram showing changes in potentials of supply lines SAP and SAN in an enlarged manner.

FIG. 9 is a waveform diagram showing changes in the potentials of the supply lines SAP and SAN in an enlarged manner.

As shown in FIG. 9, during a period between the time t11 and the time t15, the sense amplifiers SA are activated because the potentials VARY and VSS are generally supplied to the supply lines SAP and SAN, respectively. However, during the period T3 between the time t13 and the time t14 within the period between the time t11 and the time t15, the driving of the supply lines SAP and SAN by the driver transistors 322 and 421 is temporarily stopped and accordingly the potentials of the supply lines SAP and SAN are reduced and increased, respectively. Therefore, during this period, the sense amplifiers SA are inactivated or the driving performances of the sense amplifiers SA are reduced. Therefore, as described above, this enables to invert the sense amplifiers SA quickly even when inverted data is to be overwritten to the selected bit line.

The states of the sense amplifiers SA during the period T3 between the time t13 and the time t14 depend on a length of the period T3 and parasitic capacitances of the supply lines SAP and SAN. That is, the supply lines SAP and SAN do not immediately return to the pre-charge level even when the driving of the supply lines SAP and SAN by the driver transistors 322 and 421 is stopped because the supply lines SAP and SAN have some parasitic capacitances. Accordingly, at least during a period until the supply lines SAP and SAN return to the pre-charge level, the sense amplifiers SA do not immediately become completely inactivated states but shift toward the inactivated states while reducing the driving performances, although the sense amplifiers SA are inactivated due to stop of the driving of the supply lines SAP and SAN by the driver transistors 322 and 421.

As described above, while the control of temporarily inactivating the sense amplifiers SA is executed during the period T3, the driving performances of the sense amplifiers SA are reduced toward the inactivated states in practical operations. Accordingly, data of the bit lines that are not selected, that is, the bit lines to which the write data is not overwritten are correctly held in the corresponding sense amplifiers SA.

This enables to control the sense amplifiers SA collectively regardless of whether the sense amplifiers SA are selected based on the column address CA, and eliminate the need to provide a control circuit in each of the sense amplifiers SA. Accordingly, the circuit scale of the sense-amplifier control circuit 100 can be reduced and an increase in the chip area can be suppressed.

A second embodiment of the present invention is explained next.

Figure 10:
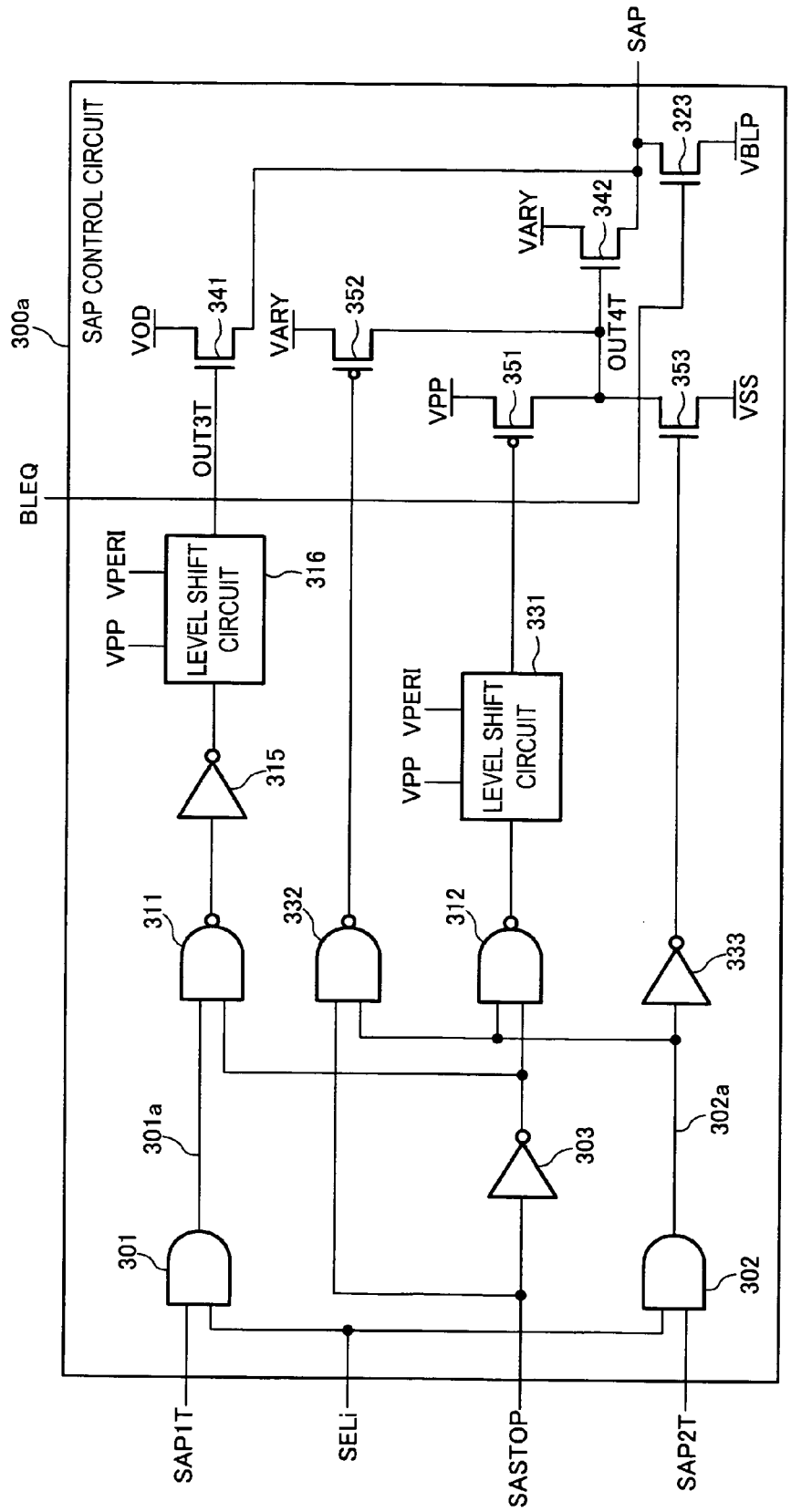

FIG. 10 is a circuit diagram of a SAP control circuit 300a to be used in the second embodiment. In FIG. 10, constituent elements identical to those of the SAP control circuits 300 shown in FIG. 6 are denoted by like reference numerals and redundant explanations thereof will be omitted.

The SAP control circuit 300a shown in FIG. 10 includes an overdrive transistor 341 and a driver transistor 342, which are connected to the supply line SAP. This point is the same as in the SAP control circuit 300 shown in FIG. 6. However, in the second embodiment, the overdrive transistor 341 is an N-channel MOS transistor having a drain to which an overdrive potential VOD is supplied and a source that is connected to the corresponding supply line SAP. The output of the NAND circuit 311 is supplied to a gate electrode of the overdrive transistor 341 via an inverter 315 and a level shift circuit 316. The level shift circuit 316 converts an input signal with an amplitude between VSS and VPERI into an output signal with an amplitude between VSS and VPP (>VOD).

This enables the corresponding supply line SAP to be driven to the supply potential VOD when a signal OUT3T, which is an output of the level shift circuit 316, is activated to a high level (a VPP level).

On the other hand, a signal OUT4T is supplied to a gate electrode of the driver transistor 342 by a P-channel MOS transistor 351 or 352 or an N-channel MOS transistor 353. These transistors 351 to 353 are exclusively turned on. Specifically, the transistor 351 is turned on when the signal OUT4T has the VPP level, the transistor 352 is turned on when the signal OUT4T has the VARY level, and the transistor 353 is turned on when the signal OUT4T has the VSS level. When the signal OUT4T has the VPP level, the driver transistor 342 is turned on and the supply line SAP is driven to an array potential VARY. Also when the signal OUT4T has the VARY level, the driver transistor 342 is turned on and the supply line SAP is driven to a potential (VARY-Vt), which is a potential lower than the array potential VARY by a threshold voltage (Vt) of the driver transistor 342. When the signal OUT4T has the VSS level, the driver transistor 342 is turned off.

The output of the NAND circuit 312 is supplied to a gate electrode of the transistor 351 via a level shift circuit 331. The level shift circuit 331 converts an input signal with an amplitude between VSS and VPERI into an output signal with an amplitude between VSS and VPP (>VPERI).

An output of an NAND circuit 332 is supplied directly to a gate electrode of the transistor 352. The sense-amplifier stop signal SASTOP and the signal 302a are inputted to the NAND circuit 332.

Further, a signal obtained by inverting the signal 302a using an inverter 333 is inputted to a gate electrode of the transistor 353.

With this configuration, when the corresponding selection signal SELi is active at a high level, the overdrive transistor 341 is turned on when the sense-amplifier activation signal SAP1T is activated and the driver transistor 342 is turned on when the sense-amplifier activation signal SAP2T is activated. A gate voltage of the driver transistor 342 is determined by the sense-amplifier stop signal SASTOP. The gate voltage is caused to have the VPP level by the transistor 351 when the sense-amplifier stop signal SASTOP is inactive at a low level, and the gate voltage is caused to have the VARY level by the transistor 352 when the sense-amplifier stop signal SASTOP is active at a high level.

Figure 11:
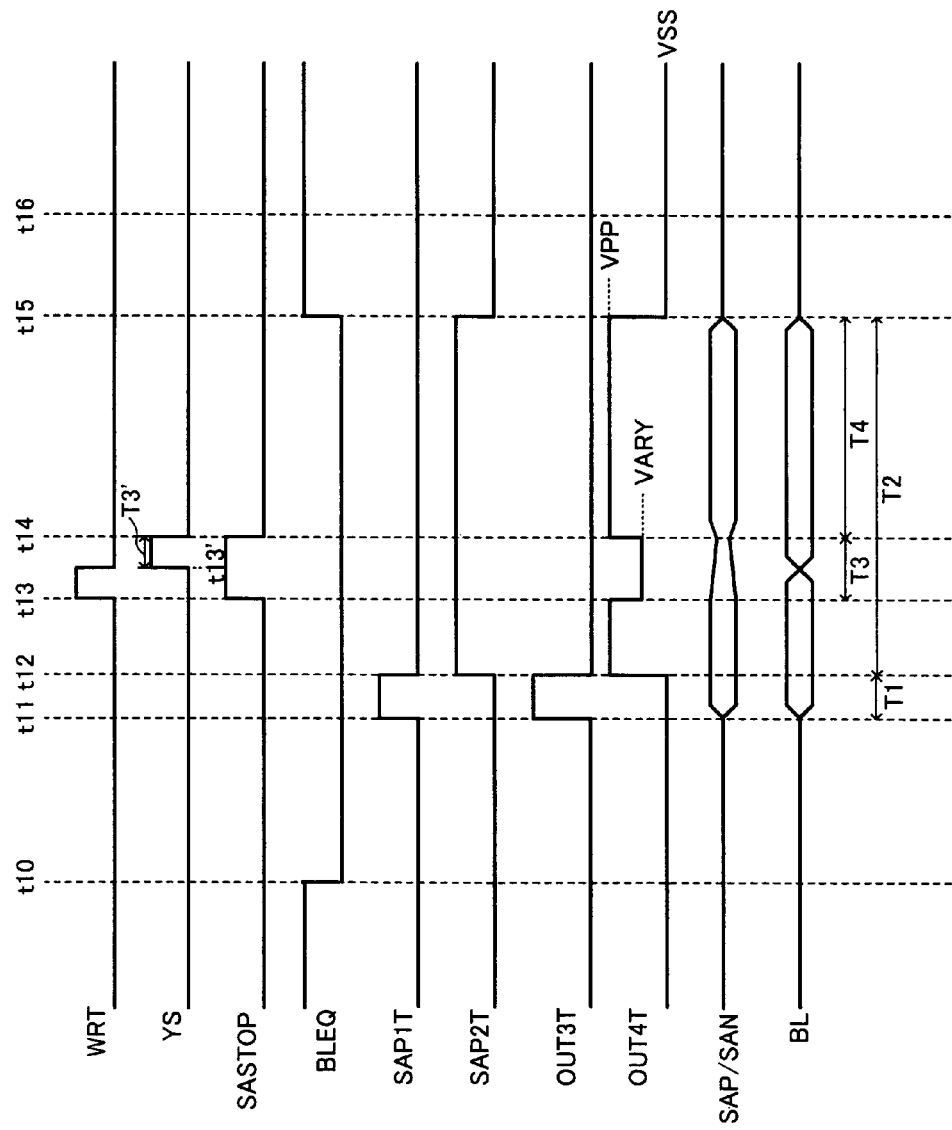
FIG. 11 is an operation waveform diagram for explaining a write operation of the semiconductor device 10 when the SAP control circuit 300a is used.

FIG. 11 is an operation waveform diagram for explaining a write operation of a semiconductor device according to the second embodiment.

The operation according to the second embodiment is different from that already described such that the driving level of the supply line SAP is reduced from VARY to VARY-Vt during the period T3 between the time t13 and the time t14, instead of stopping the driving of the supply line SAP. That is, during the period T3, the driving performances of the sense amplifiers SA are reduced, instead of temporarily inactivating the sense amplifiers SA. Accordingly, even when inverted data is overwritten to a selected bit line like in the first embodiment, the sense amplifier SA can be inverted quickly. Furthermore, because the level of the supply line SAP is kept at VARY-Vt, the level of the supply line SAP can be quickly returned to the array potential VARY when a restore operation is started at the time t14. This enables to reduce a restore period as compared to the first embodiment.

It is apparent that the present invention is not limited to the above embodiments, but may be modified and changed without departing from the scope and spirit of the invention.

Figure 12:
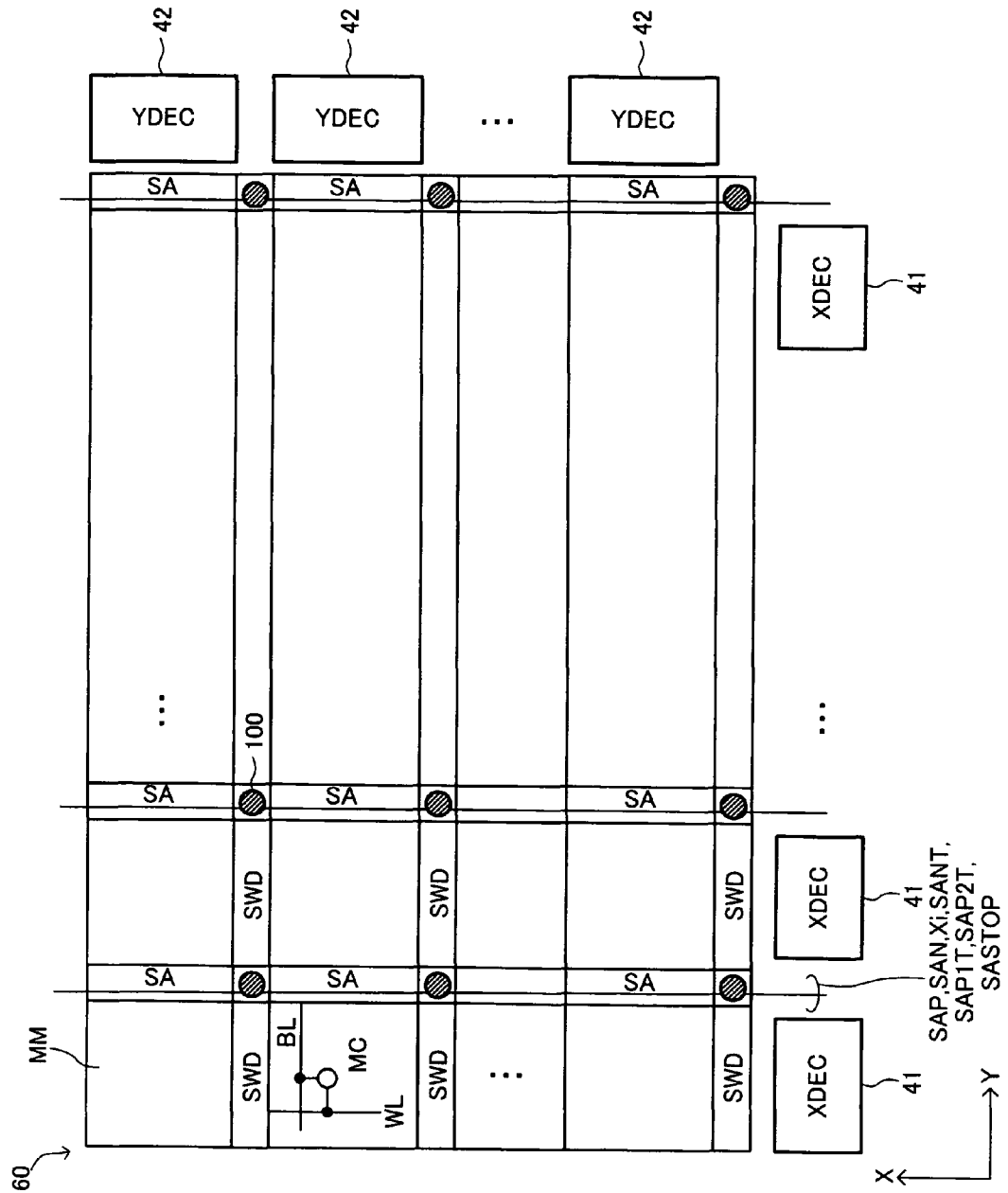
FIG. 12 is a schematic diagram for explaining a layout of a sense-amplifier control circuit according to a modification.

For example, with respect to the layout of the sense-amplifier control circuit 100, provision thereof along the side 60a of the memory cell array 60 as shown in FIG. 2 is not essential and the sense-amplifier control circuit 100 can be placed in a distributed manner within the memory cell array 60 in crossing areas between lines of the sub-word drivers SWD extending in the Y direction and lines of the sense amplifiers SA extending in the X direction, as shown in FIG. 12. In this case, it suffices that the common supply lines SAP and SAN are driven by a plurality of the sense-amplifier control circuits 100 placed along an arrangement direction of the sense amplifiers SA. This layout is useful when there are free spaces at the crossing areas.

In the present invention, driving stop or level change of both of the supply lines SAP and SAN in response to the sense-amplifier stop signal SASTOP is not essential and the above operations can be performed for only one of the supply lines SAP and SAN. For example, the supply lines SAP can be supplied with VARY during an inactive period of the sense-amplifier stop signal SASTOP and supplied with VARY-Vt during an active period of the sense-amplifier stop signal SASTOP, and the supply lines SAN can be supplied with VSS regardless of the sense-amplifier stop signal SASTOP. In this case, a voltage between the supply lines SAP and SAN during the inactive period of the sense-amplifier stop signal SASTOP becomes VARY-VSS, and a voltage between the supply lines SAP and SAN during the active period of the sense-amplifier stop signal SASTOP is reduced to (VARY-Vt)-VSS.

Furthermore, in the present invention, even the driving stop or level change of the supply lines SAP or SAN in response to the sense-amplifier stop signal SASTOP is not essential and it suffices that at least the driving performances of the sense amplifiers SA are reduced. For example, two transistors having a same output voltage to the supply lines SAP and having different current supplying capacities can be used. In such a case, the transistor having a larger current supplying capacity is turned on when the sense-amplifier stop signal SASTOP is in an inactive state and the transistor having a smaller current supplying capacity is turned on when the sense-amplifier stop signal SASTOP is in an active state.

What is claimed is:

1. A semiconductor device comprising:
a plurality of memory cells connected to a word line;
a plurality of sense amplifiers each assigned to an associated one of the memory cells; and
a control circuit that activates the sense amplifiers in response to selection of the word line,
wherein in response to a request for writing of data to any one of the memory cells, a driving performance of the plurality of sense amplifiers is temporarily reduced,
wherein the control circuit includes a drive transistor that supplies an operating voltage to the sense amplifiers,
wherein the control circuit is configured to supply a first voltage to a control electrode of the driver transistor in response to selection of the word line, and is configured to supply a second voltage that is different from the first voltage to the control electrode of the driver transistor in response to the request for writing of data to any of the memory cells,
wherein both of the first and second voltages bring the driver transistor into an on state, and the operating voltage that is supplied when the second voltage is supplied to the control electrode is lower than the operating voltage that is supplied when the voltage is supplied to the control electrode.

2. The semiconductor device as claimed in claim 1, wherein the control circuit includes an overdrive circuit that supplies an overdrive voltage higher than the operating voltage to the sense amplifiers, and the overdrive circuit is activated after the word line is selected and before the second voltage is supplied to the control electrode of the driver transistor.

3. The semiconductor device as claimed in claim 1, wherein the memory cells and the sense amplifiers are provided in a memory cell array and the control circuit is arranged outside the memory cell array along a side of the memory cell array.

4. The semiconductor device as claimed in claim 1, wherein the memory cells and the sense amplifiers are provided in a memory cell array and the control circuit is arranged within the memory cell array along an arrangement direction of the sense amplifiers.

5. The semiconductor device as claimed in claim 1, wherein an amount of data held in the memory cells is reduced by selection of the word line and restored by activation of the sense amplifiers.

6. A semiconductor device comprising:
a plurality of memory cells;
a plurality of bit lines each assigned to an associated one of the plurality of memory cells;
a plurality of sense amplifiers each assigned to an associated one of the bit lines;
a supply line connected to the plurality of sense amplifiers for supplying an operating voltage to the sense amplifiers; and
a control circuit including a drive transistor connected to the supply line to supply the operating voltage to the supply line, the control circuit being configured to supply a first voltage to a control gate of the drive transistor during a first period in an activation period of a sense-amplifier activation signal that is activated in response to an active command, supply a second voltage lower than the first voltage to the control gate of the drive transistor during a second period in response to a write command in the activation period of the sense-amplifier activation signal, the first and second voltages bring the driver transistor into an on state and the operating voltage that is supplied when the second voltage is supplied to the control electrode is lower than the operating voltage that is supplied when the voltage is supplied to the control electrode.

7. The semiconductor device as claimed in claim 6, wherein the memory cells are commonly connected to a word line and are electrically connected to corresponding ones of the bit lines, respectively, in response to activation of the word line according to the active command.

8. A semiconductor device comprising:
a memory cell;
a word line coupled to the memory cell;
a sense amplifier coupled to the memory cell;
a control circuit including a drive transistor to supply an operating voltage to the sense amplifier, the control circuit being configured to supply a first voltage to a control gate of the drive transistor in response to a selection of the word line so that the operating voltage corresponding to the first voltage is supplied to the sense amplifier through the drive transistor, the control circuit being configured to supply a second voltage lower than the first voltage to the control gate of the drive transistor in response to a request for writing a data to the memory cell so that the operating voltage corresponding to the second voltage is supplied to the sense amplifier through the drive transistor wherein the first and second voltages bring the drive transistor into an on state.

9. The semiconductor device as claimed in claim 8, wherein the control circuit includes an overdrive circuit that supplies an overdrive voltage higher than the operating voltage to the sense amplifier.

10. The semiconductor device as claimed in claim 8, wherein the memory cell and the sense amplifier are provided in a memory cell array and the control circuit is arranged outside the memory cell array along a side of the memory cell array.

11. The semiconductor device as claimed in claim 8, wherein the memory cell and the sense amplifier are provided in a memory cell array and the control circuit is arranged within the memory cell array along an arrangement of the sense amplifier.

12. The semiconductor device as claimed in claim 8, wherein an amount of data held in the memory cell is reduced by selection of the word line and restored by activation of the sense amplifier.

13. The semiconductor device as claimed in claim 1, wherein the drive transistor is a N-channel MOS transistor.

14. The semiconductor device as claimed in claim 6, wherein the drive transistor is a N-channel MOS transistor.

15. The semiconductor device as claimed in claim 8, wherein the drive transistor is a N-channel MOS transistor.

16. The semiconductor device as claimed in claim 1, the semiconductor device further comprising an equalize transistor coupled between the sense amplifier and a line supplied with an intermediate potential between a supply potential and a ground potential.

17. The semiconductor device as claimed in claim 6, the semiconductor device further comprising an equalize transistor coupled between the supply line and a line supplied with an intermediate potential between a supply potential and a ground potential.

18. The semiconductor device as claimed in claim 8, the semiconductor device further comprising an equalize transistor coupled between the sense amplifier and a line supplied with an intermediate potential between a supply potential and a ground potential.

* * * * *